United States Patent [19]

Lo Cascio

[11] 4,406,955
[45] Sep. 27, 1983

[54] COMPARATOR CIRCUIT HAVING HYSTERESIS

[75] Inventor: James J. Lo Cascio, Mesa, Ariz.

[73] Assignee: Motorola, Inc., Schaumburg, Ill.

[21] Appl. No.: 269,250

[22] Filed: Jun. 1, 1981

[51] Int. Cl.³ .................... H03K 5/153; H03K 5/24
[52] U.S. Cl. ............................ 307/355; 307/359; 307/362
[58] Field of Search ............... 307/350, 530, 354, 355, 307/356, 359, 362

[56] References Cited

U.S. PATENT DOCUMENTS

| | | | |
|---|---|---|---|
| 3,805,093 | 4/1974 | Hodemaekers | 307/350 |
| 3,848,139 | 11/1974 | Holt, Jr. | 307/355 |
| 3,872,323 | 3/1975 | Frederiksen et al. | 307/362 |

*Primary Examiner*—John Zazworsky
*Attorney, Agent, or Firm*—Michael D. Bingham

[57] ABSTRACT

A high-gain comparator circuit having an upper and lower input offset voltage associated therewith to establish hysteresis in response to a differential input signal supplied thereto. The output level state of the comparator circuit is caused to be switched from a first output level to a second output level in response to the differential input signal exceeding the upper offset voltage only after the hysteresis has been initiated whereby the comparator circuit is less susceptible to being caused to erroneously switch states due to noise transients. The comparator circuit comprises a differential amplifier adapted to receive the differential input signal for producing differential currents in first and second outputs thereof and includes first and second current mirror circuits coupled in parallel to the first and second differential outputs of the differential amplifier which produced the upper and lower input offset voltages in the comparator circuit when respectively activated.

11 Claims, 3 Drawing Figures

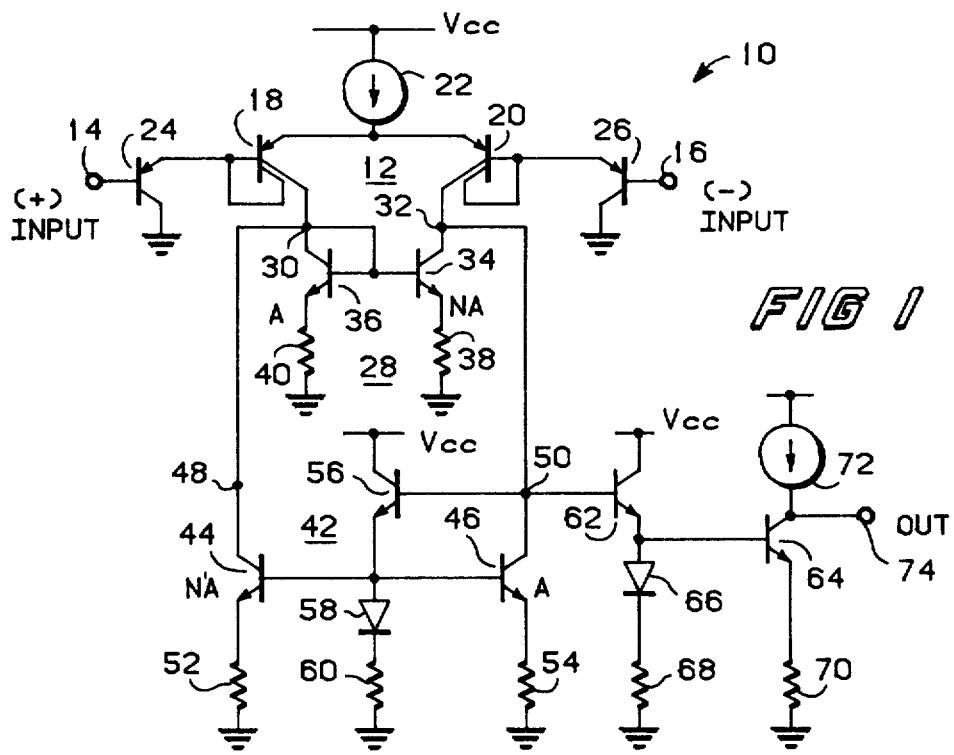
*FIG 1*
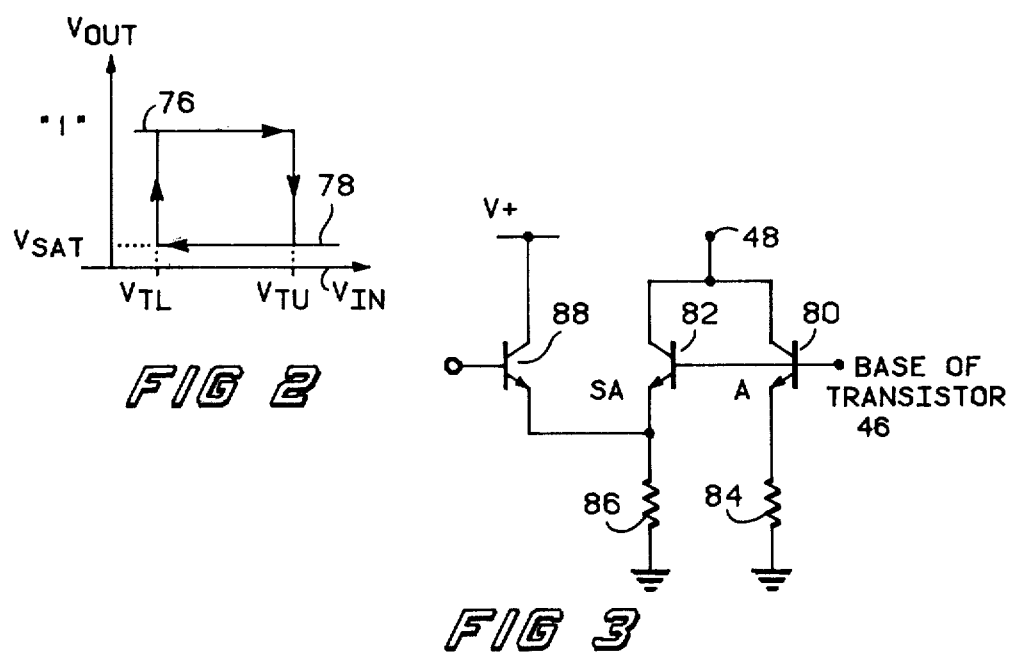
*FIG 2*
*FIG 3*

4,406,955

COMPARATOR CIRCUIT HAVING HYSTERESIS

BACKGROUND OF THE INVENTION

1. Field of the Invention

This invention relates to voltage comparator circuits and more particularly to a high-gain voltage comparator circuit suitable for manufacture in integrated circuit form having hysteresis associated therewith which is generated internally to the comparator circuit.

2. Description of the Prior Art

High gain integrated differential comparison amplifier circuits for providing output level states indicative of the magnitude of an input differential signal supplied thereto and having differential-to-single-ended converter circuits associated therewith are well known in the art. For instance, U.S. Pat. Nos. 3,649,846 and 3,872,323 describe such comparison circuits.

Generally, it is desirous to have any input offset voltage of the comparison amplifier circuit at zero so that as the magnitude of the differential input signal passes through the zero threshold level either in a positive or negative sense, the output of the comparison amplifier circuit is caused to switch between two output level states. However, some prior art comparison amplifier circuits of the type aforedescribed have a serious problem if they are to be utilized in a very high noise environment wherein relatively high noise transients may be generated. For example, if a noise transient occurs at or near the time that the differential input signal crosses through the zero threshold level the output of the comparison amplifier circuit can be caused to erroneously switch output states due to the noise transients as generally is understood.

To overcome the problems due to noise transients, some contemporary comparison amplifier circuits employ hysteresis. Typically the hysteresis is generated externally to the operation of the comparator circuit by circuitry which is responsive to the output from the comparator circuit switching states.

It may be desirous to have a comparison amplifier circuit capable of generating hysteresis internal to the comparison circuit and for allowing switching of the output of the comparison circuit between two output level states only after hysteresis has already been initiated internally to the circuit.

SUMMARY OF THE INVENTION

It is an object of the present invention to provide an improved differential comparison circuit with hysteresis.

It is another object of the present invention to provide an improved differential comparison amplifier circuit having hysteresis which is generated internally to the comparison circuit.

It is a further object of the present invention to provide a differential comparison amplifier circuit having positive and negative input offset voltage levels which are generated in response to an input differential signal being applied thereto such that hysteresis is provided which occurs prior to the switching of the output level state of the comparison circuit.

The foregoing and other objects are met by the present invention by providing a comparison circuit comprising a differential amplifier circuit having first and second inputs adapted to receive an input differential signal and first and second outputs; and first and second current mirror circuits coupled in parallel with respect to each other to the first and second outputs of the differential amplifier for providing respectively first and second input offset voltages in the differential amplifier circuit when rendered active in accordance with the magnitude of the input differential signal being varied.

BRIEF DESCRIPTION OF THE DRAWINGS

FIG. 1 is a schematic diagram illustrating the embodiment of the present invention;

FIG. 2 is a waveform diagram useful in explaining the operation of the invention described in FIG. 1; and FIG. 3 is a schematic diagram of a circuit to be utilized in conjunction with the invention of FIG. 1 for varying the amount of hysteresis provided by the invention.

DETAILED DESCRIPTION OF THE INVENTION

Turning to FIGS. 1 and 2, the embodiment of the present invention can be explained. Comparator 10 which is suitable to be manufactured in integrated circuit form is shown as comprising a differential amplifier 12 having differential inputs 14 and 16 adapted to receive a differential input signal applied thereacross. Differential amplifier 12 comprising split collector lateral PNP transistors 18 and 20 which are emitter-coupled to current source 22 to a source of operating potential $V_{CC}$ also includes PNP transistors 24 and 26 the bases of which are coupled respectively to inputs 14 and 16 with the respective collectors coupled to a source of ground reference potential. The emitters of transistors 24 and 26 are coupled respectively to the base electrodes of transistors 18 and 20. The differential output of amplifier 12 is taken at the collectors of transistors 18 and 20 and, as understood, in response to the differential input signal supplied thereto differential currents flow from the collectors of transistors 18 and 20 accordingly. A first current mirror or differential-to-single-ended converter circuit 28 is shown coupled to the differential outputs of differential amplifier 12 at nodes 30 and 32. Current mirror circuit 28 includes transistor NPN 34 and diode connected NPN transistor 36. The base electrodes of transistors 34 and 36 are connected to each other with the respective emitters thereof coupled via resistors 38 and 40 to the ground reference potential. Coupled in parallel to current mirror circuit 28 to the differential outputs of differential amplifier 12 is a second current mirror or differential-to-single-ended converter circuit 42 comprising NPN transistors 44 and 46. The collector of transistor 44 is connected at node 48 to node 30 (the first output of differential amplifier 12) and has its base coupled in common to the base of transistor 46. The collector of transistor 46 is connected at node 50 to node 32; the output of current mirror 28 and differential amplifier 12. The respective emitters of transistors 44 and 46 are coupled via resistors 52 and 54 to the ground reference potential. Current mirror circuit 42 also includes NPN transistor 56 the collector of which is returned to $V_{CC}$, the base being coupled to node 50 and the emitter being coupled to the common base electrodes of transistors 44 and 46 and returned through diode 58 and resistor 60 to ground reference potential. An output circuit means comprising NPN transistors 62 and 64 is shown coupled via node 50 to the output of current mirror 28 at node 32. The emitter of transistor 62 is coupled to the base of transistor 64 and is returned to the ground reference potential via diode 66 and resistor 68. The emitter of transistor 64 is returned to ground reference potential through resistor 70 and has the collector thereof coupled to a current source 72 which with the collector of transistor 62 is coupled to $V_{CC}$. An output terminal 74 is shown coupled to the collector of transistor 64.

Assuming that current mirror 28 is in an active state and current mirror 42 is in an inactive state and further that the potential appearing at input terminal 14 is less than the potential appearing at input terminal 16 the following conditions exist. Diode connected transistor 36 will be rendered conductive by the differential current flowing from the collector of transistor 18. Although differential current may be flowing from the collector of transistor 20 to the collector of transistor 34, the magnitude of this current is less than that of the current flowing from transistor 18. Because transistors 34 and 36 are matched devices with the emitter area of transistor 34 being N times greater than the emitter of transistor 36, the former transistor is in a saturated state whereby no current flows from node 32 into node 50. Hence, current mirror 42 as well as the output circuitry comprising transistor 62 and 64 will be biased in an off or non-active state.

As generally is understood to those skilled in the art, the balanced state of current mirror 28, i.e., the state at which transistor 34 is no longer saturated occurs when the input offset voltage, the voltage appearing across the input terminals 14 and 16, is such that the current from transistor 20 is N times greater than the current flowing from transistor 18. Thus, whenever the differential input signal, $V_{IN}$, reaches this offset voltage level the differential current supplied from differential amplifier 12 to current mirror 28 is such as to set current mirror 28 in a balanced condition. It can be shown that this input offset voltage, VTU (FIG. 2), is equal to:

$$VTU = \frac{2nkT}{q} \ln N$$

Where n is a high current injection factor typically equal to the numeral 1, k is Boltzman's constant, T is the absolute temperature, and q is the charge of an electron. For instance, if N=1, the positive offset voltage, VTU, would be zero.

From the foregoing, when $V_{IN}$ is less than the upper offset voltage VTU, transistor 34 being in a saturated state, transistors 62 and 64 are nonconductive whereby the output of comparator 10 is in an upper level state, waveform portion 76 of FIG. 2. As the differential input signal increases to the level where the current from collector 20 becomes N times greater than the collector current from transistor 18 any further incremental change in this voltage will cause an incremental excess current to flow from node 32 to node 50 to be supplied to current mirror 42. Whenever this current is enough to produce a mirrorable current through current mirror 42, a positive regeneration occurs wherein current mirror 28 is quickly rendered inactive through the feedback regeneration loop of current mirror 42 which is now rendered active. Thus, as the mirrorable current renders transistors 56 and 46 conductive, transistor 44 is in turn rendered conductive. Transistor 44 having an emitter area N' times greater than the emitter of transistor 46 wants to conduct N' times as much collector current as the latter device which causes current to be sourced from node 30. Transistor 44 sourcing current away from node 30 renders transistor 36 of current mirror 28 less conductive. The amount of collector current which is sourced by transistor 34 is decreased which allows more current to be sourced from node 32 to the collector of transistor 46. This in turn causes transistor 44 to conduct harder to source most current from node 30 and current mirror 28 to be quickly rendered inactive. It is important to note that the regeneration occurs in a high gain loop such that initiation of the inactivation of current mirror 28 does not cause a change in the output state of comparator 10. As current mirror 42 is rendered active, the input offset voltage of comparator 10 is decreased to a second value equal to:

$$VTL = \frac{2nkT}{q} \ln N'$$

Some time after the hysteresis has occurred, i.e., the input offset voltage of comparator 10 being reduced from the value of VTU to the value VTL, the output level state of comparator 10 is allowed to switch states due to transistor 62 and 64 being rendered conductive. It is important to note that regeneration occurs to render current mirror circuit 28 inactive when only a mirrorable amount of current is available to current mirror circuit 42 without any further change in differential input voltage being required. If, for explanation purposes, the base current drive to transistor 64 causes this transistor to become saturated, the output voltage level state of comparator 10 will switch to a level equal to the saturation voltage of the transistor; waveform portion 78 of FIG. 2.

Comparator 10 will remain at the lower level state until such time as the differential input signal reaches the second input offset voltage VTL wherein the collector current of transistor 18 becomes N' times the collector current of transistor 20. Any further incremental voltage change in the input voltage below this lower offset voltage will produce a mirrorable current to the diode connected transistor 36 to cause a regenerative feedback process as aforedescribed with respect to the inactivation of current mirror 28. Thus, current mirror 42 becomes inactive and current mirror 28 will become active without any further changes in the input voltage occurring. When current mirror 28 is activated, the input offset voltage of comparator 10 is caused to be increased to the level VTU prior to the output level state of comparator 10 switching to the upper level state.

The significant feature of the present invention is that as the differential input signal varies between the upper and lower input offset voltage levels, hysteresis occurs prior to the output of the comparator being switched. Hence, the comparator is not sensitive to noise transients occurring exactly at the switching of the comparator's output level states.

Another important feature of the invention is that the amount of hysteresis, as well as the magnitude of the upper and lower offset voltages, can be varied by varying the emitter area ratios N and N' accordingly.

Turning to FIG. 3, there is shown a circuit wherein the lower offset voltage level VTL can be varied during the operation of comparator 10. Thus, NPN transistors 80 and 82 which have their collectors connected in common as well as the bases thereof can be utilized in place of transistor 44 wherein the collectors of transistors 80 and 82 are connected to node 48 and the base electrodes thereof connect to the base of transistor 46. The emitters of these two transistors are coupled through respective resistors 84 and 86 to ground reference potential. A buffer NPN transistor 88 is utilized with its emitter coupled to the emitter of transistor 82, its collector coupled to a source of potential V+, and its base adapted to receive a control input signal. By way of example, the emitter area of transistor 82 is five times greater than the emitter area of transistor 80 such that with transistor 88 being in a non-conductive state, the lower offset voltage level VTL would be a function of the natural log of 6, N' being equal to 6. However, by rendering transistor 88 conductive, transistor 82 can be biased to an off condition whereby the lower offset voltage level which is equal to the ratio of the emitter area of transistor 80 to the emitter area of transistor 46, now one reduces the lower offset voltage to a value of zero.

Thus, what has been described above, is a high-gain comparator circuit having hysteresis the amount of which can be varied and which occurs prior to switching of the output state of the comparator as the input signal thereto is varied in a positive and negative sense.

I claim:

1. Comparator circuit having hysteresis, the hysteresis being caused to occur prior to the output of the comparator circuit switching output level states in response to a differential input signal being supplied thereto comprising:

differential amplifier means having first and second inputs, first and second outputs, said first and second inputs being responsive to the differential signal supplied thereto for producing differential currents at said first and second outputs;

first current mirror means coupled to said first and second outputs of said differential amplifier means for producing a first predetermined input offset voltage in said differential amplifier means when activated;

second current mirror means coupled to said first and second outputs of said differential amplifier means in parallel to said first current mirror means for producing a second predetermined input offset voltage in said differential amplifier means when activated, said second current mirror means being activated by the magnitude of the differential input signal incrementally exceeding said first predetermined input offset voltage in a positive sense for regeneratively inactivating said first current mirror means and said first current mirror means being activated by said magnitude of the differential input signal incrementally exceeding said second input offset voltage in a negative sense for regeneratively inactivating said second current means such that hysteresis is produced internally to the comparator circuit; and output circuit means including first and second transistors each having a base, collector and an emitter, said base of said first transistor being coupled to said second output of said differential amplifier means, said emitter being coupled to said base of said second transistor, said emitter of said second transistor being coupled to a first terminal at which is supplied a reference potential, said collectors being coupled to a second terminal at which is supplied an operating potential with said collector of said second transistor being coupled to the output of the circuit, and diode bias means coupled between said emitter of said first transistor and said first terminal for biasing said first transistor.

2. The comparator circuit of claim 1 wherein said first current mirror means includes:

semiconductor diode means coupled between said first output of said differential amplifier means and said first terminal; and a transistor having an emitter, collector and base, said emitter being coupled to said first terminal, said collector being coupled to said second output of said differential amplifier means, said base being coupled to said first output of said differential amplifier means.

3. The comparator circuit of claim 2 wherein said second current mirror means includes:

semiconductor diode means coupled between said second output of said differential amplifier means and said first terminal; and a transistor having emitter, collector and base, said emitter being coupled to said first terminal, said collector being coupled to said first output of said differential amplifier means and said base being coupled to said second output of said differential amplifier means.

4. The comparator circuit of claim 3 wherein said semiconductor diode means of said first current mirror means is a transistor having an emitter, collector and base, said emitter being coupled to said first terminal, said base and collector being interconnected to both said first output of said differential amplifier means and said base of said transistor of said first current mirror means, the area of said emitter of said first transistor of said first current mirror means being N times greater than the area of said emitter of said transistor of said semiconductor diode means.

5. The comparator circuit of claim 3 or 4 wherein:

said semiconductor diode means of said second current mirror means includes first and second transistors each having an emitter, collector and base, said base of said first transistor and said collector of said second transistor being interconnected to said second input of said differential amplifier means, said emitter of said first transistor and said base of said second transistor means being interconnected to said base of said transistor of said second current mirror means, said collector of said first transistor being coupled to said second terminal and said emitter of said second transistor being coupled to said first terminal; and said emitter of said transistor of said second current mirror means having an area N' times greater than the emitter area of said second transistor.

6. The comparator circuit of claim 5 wherein said second current mirror means includes third semiconductor diode means coupled between said emitter of said first transistor and said first terminal.

7. The comparator circuit of claim 6 wherein said differential amplifier means includes:

first and second transistors each having an emitter, dual collectors and a base, said emitters being coupled to source of current for supplying a constant current to said differential amplifier means, one of said dual collectors of said first transistor being said first output of said differential amplifier means and one of said dual collectors of said second transistor being said second output, the other one of said dual collectors of said first and second transistors being coupled to said respective base thereof; and third and fourth transistors each having an emitter, collector and base, the bases being said first and second respective inputs of said differential amplifier means, the emitters of said third and fourth transistors being connected respectively to the bases of said first and second transistors, said collectors being coupled to said first terminal.

8. The comparator circuit of claim 2 wherein said second current mirror means includes:
- semiconductor diode means coupled between said second output of said differential amplifier means and said first terminal;
- first and second transistors each having a base, an emitter, and a collector, said bases being coupled with said second output of said differential amplifier means, said emitters being coupled to said first terminal and being area ratioed with respect to each other; and
- a third transistor having a base, an emitter and a collector, said base being connected to a third terminal at which is supplied a control signal, said emitter being coupled to said first terminal and said collector being coupled to a terminal at which is supplied a bias potential.

9. The comparator of claim 4 wherein said second current mirror means includes:
- a first transistor having a base, an emitter and a collector, said base being connected to said base of said transistor of said second current mirror means, said collector being coupled to said first output of said differential amplifier means and said emitter being coupled to said first terminal; and
- a second transistor having a base, an emitter and a collector, said base being coupled to a third terminal at which is supplied a control signal, said collector being coupled to a fourth terminal at which is supplied a bias potential, said emitter being coupled to said first terminal.

10. The comparator circuit of claim 8 wherein said semiconductor diode means of said second current mirror means includes:
- a diode coupled between said base of said first transistor and said first terminal; and
- first and second additional transistors each having a base, an emitter and a collector, said base of said first additional transistor and said collector of said second additional transistor being coupled to said second output of said differential amplifier means, said emitter of said first additional transistor and said base of said second additional transistor being coupled to said base of said first transistor, said collector of said first additional transistor being coupled to said second terminal and said emitter of said second additional transistor being coupled to said first terminal.

11. The comparator circuit of claim 9 wherein said semiconductor diode means of said second current mirror means includes:
- a diode coupled between said base of said first transistor and said first terminal; and
- first and second additional transistors each having a base, an emitter and a collector, said base of said first additional transistor and said collector of said second additional transistor being coupled to said second output of said differential amplifier means, said emitter of said first additional transistor and said base of said second additional transistor being coupled to said base of said first transistor, said collector of said first additional transistor being coupled to said second terminal and said emitter of said second additional transistor being coupled to said first terminal.

* * * * *